US010515711B2

(12) United States Patent
Lee

(10) Patent No.: US 10,515,711 B2
(45) **Date of Patent: *Dec. 24, 2019**

(54) SEMICONDUCTOR MEMORY DEVICE AND OPERATING METHOD THEREOF FOR CONTROLLING OPERATING VOLTAGES

(71) Applicant: SK hynix Inc., Gyeonggi-do (KR)

(72) Inventor: Hee Youl Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/226,410

(22) Filed: Dec. 19, 2018

(65) Prior Publication Data

US 2019/0122743 A1 Apr. 25, 2019

Related U.S. Application Data

(63) Continuation of application No. 15/720,525, filed on Sep. 29, 2017, now Pat. No. 10,192,632.

(30) Foreign Application Priority Data

Feb. 28, 2017 (KR) ........................ 10-2017-0025938

(51) Int. Cl.

| | |
|---|---|
| ***G11C 8/08*** | (2006.01) |
| ***G11C 16/04*** | (2006.01) |
| ***G11C 29/08*** | (2006.01) |
| ***G11C 11/413*** | (2006.01) |
| ***G11C 29/50*** | (2006.01) |
| ***G11C 16/08*** | (2006.01) |
| ***G11C 16/10*** | (2006.01) |
| ***G11C 16/34*** | (2006.01) |
| *G11C 29/04* | (2006.01) |

(52) U.S. Cl.

CPC ................ *G11C 29/08* (2013.01); *G11C 8/08* (2013.01); *G11C 11/413* (2013.01); *G11C 16/0483* (2013.01); *G11C 16/08* (2013.01); *G11C 16/10* (2013.01); *G11C 16/3459* (2013.01); *G11C 29/50* (2013.01); *G11C 2029/0411* (2013.01); *G11C 2029/5004* (2013.01)

(58) Field of Classification Search

CPC ..... G11C 16/3459; G11C 16/10; G11C 29/50; G11C 11/413; G11C 2029/5004; G11C 29/08

USPC ............ 365/185.17, 185.33, 185.22, 185.18, 365/185.03, 185.12

See application file for complete search history.

(56) References Cited

U.S. PATENT DOCUMENTS 10,192,632 B2 * 1/2019 Lee .......................... G11C 8/08

* cited by examiner

*Primary Examiner* — Gene N Auduong

(74) *Attorney, Agent, or Firm* — IP & T Group LLP

(57) ABSTRACT

A semiconductor memory device includes a memory cell array including a plurality of memory cells coupled between a common source line and a bit line, and a voltage generator applying operating voltages to word lines coupled to the memory cells or discharging potential levels of the word lines, wherein during a program verify operation, the voltage generator applies a program verify voltage and a pass voltage as the operating voltages to the word lines, and subsequently applies a set voltage to the common source line during a period in which the memory cells are turned on.

11 Claims, 9 Drawing Sheets

SEMICONDUCTOR MEMORY DEVICE AND OPERATING METHOD THEREOF FOR CONTROLLING OPERATING VOLTAGES

CROSS-REFERENCE TO RELATED APPLICATION

This application is a continuation of U.S. patent application Ser. No. 15/720,525 filed on Sep. 29, 2017 which claims benefits of priority of Korean Patent Application No. 10-2017-0025938 filed on Feb. 28, 2017. The disclosure of each of the foregoing application is incorporated herein by reference in its entirety.

BACKGROUND

Field of Invention

Various embodiments of the present disclosure relate generally to an electronic device and, more particularly, to a semiconductor memory device and an operating method thereof.

Description of Related Art

Semiconductor memory devices may be classified into volatile memory devices and non-volatile memory devices.

Non-volatile memory devices operate at lower write and read speeds than volatile memory devices, but they retain stored data regardless of power on/off conditions. Therefore, non-volatile memory devices are used to store data which need to be maintained even without power supply.

A flash memory which is one example of non-volatile memory devices has the advantages of both a random-access memory (RAM) and a read only memory (ROM). For example, a flash memory may be freely programmed and erased similar to a RAM. Also, similar to a ROM, a flash memory may retain the stored data even when it is not powered.

Flash memory devices may be classified into two-dimensional semiconductor devices in which strings are formed in a horizontal direction to a semiconductor device and three-dimensional semiconductor devices in which strings are formed in a vertical direction to a semiconductor device.

SUMMARY

Various embodiments are directed to a semiconductor memory device capable of reducing program disturb by preventing a channel of a string from being be boosted to a negative voltage level during a program verify operation of the semiconductor memory device, and a method of operating the same.

According to an embodiment, a semiconductor memory device may include a memory cell array including a plurality of memory cells coupled between a common source line and a bit line, and a voltage generator applying operating voltages to word lines coupled to the memory cells or discharging potential levels of the word lines, wherein during a program verify operation, the voltage generator applies a program verify voltage and a pass voltage as the operating voltages to the word lines, and subsequently applies a set voltage to the common source line during a period in which the memory cells are turned on.

According to an embodiment, a semiconductor memory device may include a memory string including a source selection transistor, a plurality of memory cells, and a drain selection transistor coupled in series between a common source line and a bit line, and a voltage generator applying operating voltages to a source selection line coupled to the source selection transistor, a plurality of word lines coupled to the plurality of memory cells, and a drain selection line coupled to the drain selection transistor, or discharging potential levels thereof during a program verify operation, wherein the voltage generator Increases a channel potential level of the memory string by applying a set voltage to the common source line or the bit line when applying a constant voltage to the source selection line, the plurality of word lines, and the drain selection line to turn on the source selection transistor, the plurality of memory cells, and the drain selection transistor.

According to an embodiment, a method of operating a semiconductor memory device may Include applying a verify voltage and a pass voltage to a plurality of word lines of a memory cell array during a program verify operation, applying a constant voltage to the plurality of word lines and selection lines, applying a set voltage to a common source line of the memory cell array when the constant voltage is applied, blocking supply of the constant voltage applied to the word lines to discharge potential levels of the word lines, and blocking the supply of the constant voltage to the selection lines to discharge potential levels of the selection lines.

DETAILED DESCRIPTION

Hereinafter, various examples of embodiments will be described in detail with reference to the accompanying drawings. The figures are provided to allow those with ordinary skill in the art to understand the scope of the embodiments of the invention. The present invention may, however, be embodied in different forms and should not be construed as limited to the embodiments set forth. Rather, these embodiments are provided so that this disclosure will be thorough and complete. In addition, the embodiments are provided to fully convey the scope of the invention to those skilled in the art.

It should be understood that, when it is described that an element is "coupled" or "connected" to another element, the element may be directly coupled or directly connected to the other element or coupled or connected to the other element through a third element. On the contrary, it should be understood that when an element is referred to as being "directly connected to" or "directly coupled to" another element, another element does not intervene therebetween. Other expressions which describe the relationship between components, that is, "between" and "directly between", or "adjacent to" and "directly adjacent to" need to be interpreted by the same manner.

Figure 1:
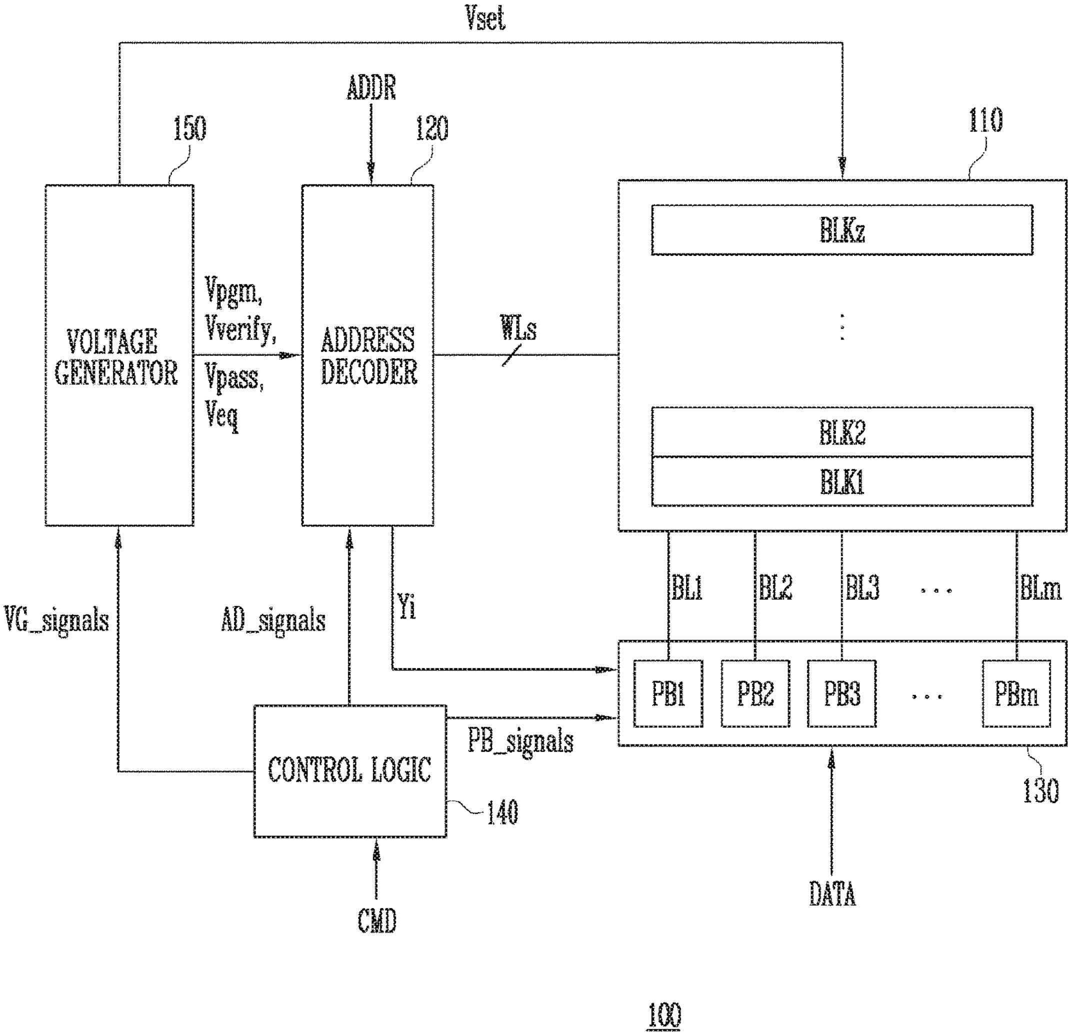
FIG. 1 is a block diagram illustrating a semiconductor memory device according to an embodiment of the present invention.

FIG. 1 is a block diagram illustrating a semiconductor memory device 100 in accordance with an embodiment of the invention.

Referring to FIG. 1, the semiconductor memory device 100 may include a memory cell array 110, an address decoder 120, a read and write circuit 130, a control logic 140, and a voltage generator 150.

The address decoder 120, the read and write circuit 130 and the voltage generator 150 may define a peripheral circuit configured to perform an operation on the memory cell array 110, such as an erase operation.

The memory cell array 110 may include a plurality of memory blocks BLK1 to BLKz. The plurality of memory blocks BLK1 to BLKz may be coupled to the address decoder 120 through word lines WLs. The memory blocks BLK1 to BLKz may be coupled to the read and write circuit 130 through bit lines BL1 to BLm. Each of the memory blocks BLK1 to BLKz may include a plurality of memory cells. According to an embodiment, the plurality of memory cells may be non-volatile memory cells. More specifically, the plurality of memory cells may be non-volatile memory cells of the charge trap type. A plurality of memory cells commonly coupled to the same word line may be defined as a single page. The memory cell array 110 may include a plurality of pages. In addition, each of the memory blocks BLK1 to BLKz of the memory cell array 110 may include a plurality of cell strings. Each of the cell strings may include a drain selection transistor, a plurality of memory cells and a source selection transistor coupled in series between a bit line and a source line (see FIG. 3).

The plurality of memory blocks BLK1 to BLKz included in the memory cell array 110 may include at least two memory blocks sharing a common source line and bit lines. This will be described below in detail.

The address decoder 120 may be coupled to the memory cell array 110 through the word lines WLs. The address decoder 120 may be configured to operate in response to control signals AD_signals received from the control logic 140. The address decoder 120 may receive an address ADDR through an input/output buffer (not illustrated) in the semiconductor memory device 100.

During a program operation, the address decoder 120 may receive a program voltage Vpgm and a pass voltage Vpass generated by the voltage generator 150, and may apply the program voltage Vpgm and the pass voltage Vpass to the word lines WLs of the memory cell array 110. In addition, during a program verify operation of the program operation, the address decoder 120 may apply the verify voltage Vverify and the pass voltage Vpass generated by the voltage generator 150 to the word lines WLs of the memory cell array 110, and then may apply a constant voltage Veq to the word lines WLs of the memory cell array 110.

The address ADDR received during an operation of the semiconductor memory device 100 may include a block address, a row address and a column address. The address decoder 120 may select one memory block and one word line according to the block address and the row address. A column address Yi may be decoded by the address decoder 120 and provided to the read and write circuit 130.

The address decoder 120 may include a block decoder, a row decoder, and a column decoder for decoding the address ADDR. The address decoder 120 may also include an address buffer.

The read and write circuit 130 may include a plurality of page buffers PB1 to PBm. The page buffers PB1 to PBm may be coupled to the memory cell array 110 through bit lines BL1 to BLm, respectively. Each of the page buffers PB1 to PBm may temporarily store data DATA input during a program voltage applying operation of a program operation and control potentials of the bit lines BL1 to BLm in response to the temporarily stored data. In addition, the read and write circuit 130 may perform a program verify operation by sensing potential levels or the amounts of current in the bit lines BL1 to BLm during the program operation.

The read and write circuit 130 may operate in response to control signals PB_signals received from the control logic 140.

The control logic 140 may be coupled to the address decoder 120, the read and write circuit 130, and the voltage generator 150. The control logic 140 may receive a command CMD through an input/output buffer (not illustrated) of the semiconductor memory device 100. The control logic 140 may be configured to control the operations of the semiconductor memory device 100 in response to the command CMD, which may include read, write, erase and other background operations.

The control logic 140 may control the address decoder 120, the read and write circuit 130, and the voltage generator 150 to perform a program voltage applying operation and a program verify operation when the command CMD corresponding to a program operation is received.

The control logic 140 may control the voltage generator 150 to apply a set voltage Vset having a positive potential level to a common source line CSL during a period in which the constant voltage Veq is applied to the memory cell array 110 or when the constant voltage Veq applying period ends during the program verify operation.

The voltage generator 150 may operate in response to control signals VG_signals received from the control logic 140.

The voltage generator 150 may generate the program voltage Vpgm and the pass voltage Vpass to apply the generated voltages to selected memory blocks, from among the memory blocks BLK1 to BLKz of the memory cell array 110, during a program voltage applying operation of a program operation under the control of the control logic 140.

In addition, the voltage generator 150 may generate the verify voltage Vverify and the pass voltage Vpass to apply the generated voltages to selected memory blocks during a program verify operation of a program operation under the control of the control logic 140. In addition, the control logic 140 may control the voltage generator 150 to generate the constant voltage Veq and apply the generated voltage to word lines and selection lines of a selected memory block, among the memory blocks BLK1 to BLKz, and selection lines of unselected memory blocks, among the memory blocks BLK1 to BLKz, during a period in which memory cells coupled to the word lines and selection transistors (i.e., a drain selection transistor and a source selection transistor) coupled to the selection lines are turned on during the program verify operation. In addition, potential levels of the word lines and the selection lines may be equalized by the constant voltage Veq.

The control logic 140 may control the voltage generator 150 to generate the set voltage Vset so that the set voltage Vset may be applied to the common source line CSL of the memory cell array 110, during a period in which the constant voltage Veq is applied, or when the constant voltage Veq applying period ends.

According to the embodiment described above with reference to FIG. 1, the voltage generator 150 may generate the set voltage Vset and apply the set voltage Vset to the common source line CSL. However, the set voltage Vset may be applied to the bit lines BL1 to BLm by using the read and write circuit 130.

Figure 2:
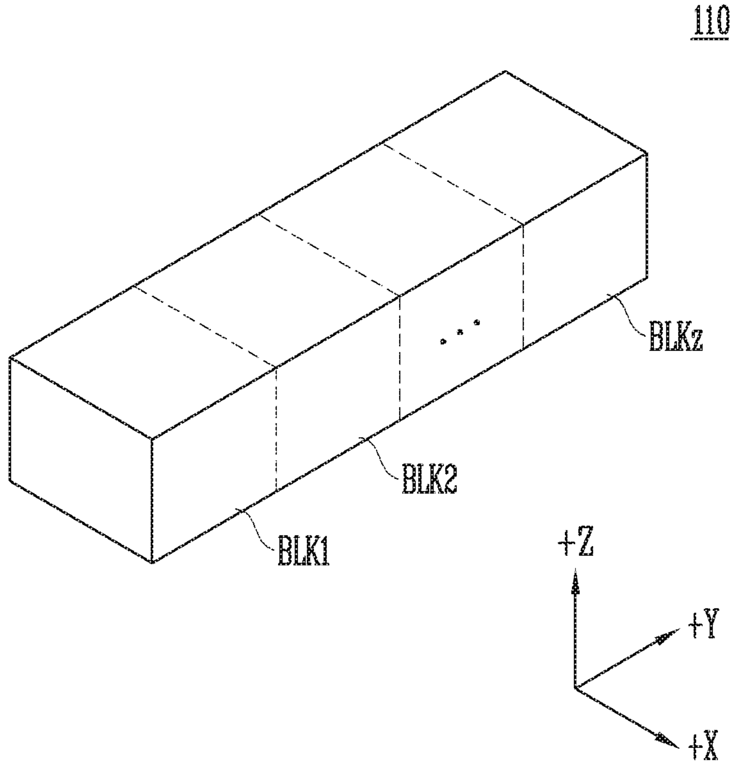
FIG. 2 is a block diagram illustrating an exemplary configuration of a memory cell array employed in the semiconductor memory device shown in FIG. 1.

FIG. 2 is a block diagram illustrating an exemplary configuration of the memory cell array 110 shown in FIG. 1.

Referring to FIG. 2, the memory cell array 110 may include the memory blocks BLK1 to BLKz. Each memory block may have a three-dimensional structure. Each memory block may include a plurality of memory cells stacked over a substrate. The plurality of memory cells may be arranged in a +X direction, a +Y direction and a +Z direction. An exemplary structure of each memory block will be described below in detail with reference to 3.

Figure 3:
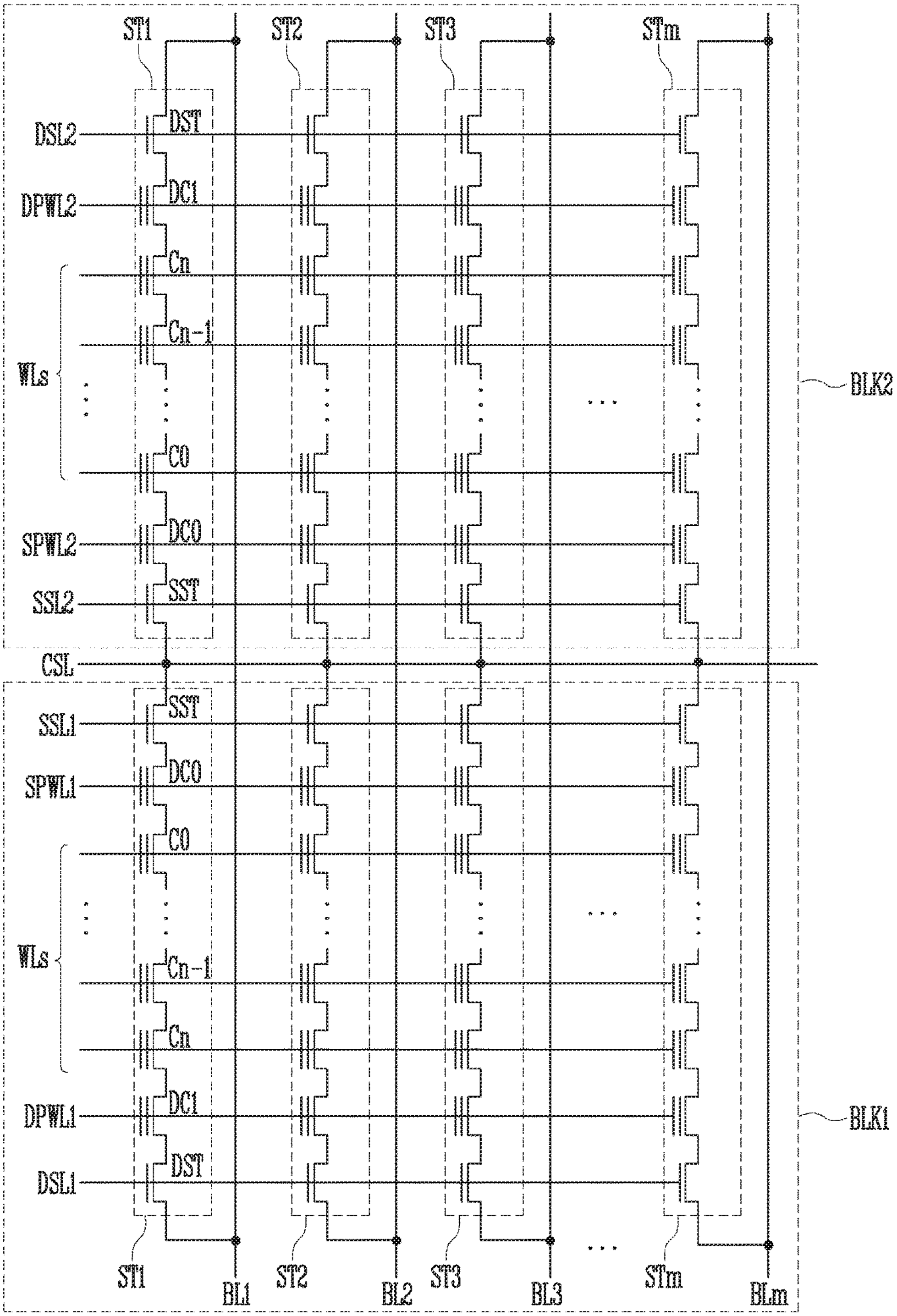
FIG. 3 is an exemplary circuit diagram illustrating memory blocks of the memory cell array shown in FIG. 1.

FIG. 3 is an exemplary circuit diagram illustrating memory blocks of the memory cell array 110 shown in FIG. 1.

The memory blocks BLK1 to BLKz as shown in FIG. 1 may be coupled to the read and write circuit 130 through the bit lines BL1 to BLm. However, for purposes of illustration and explanation, the memory block BLK1 and the memory block BLK2 are representatively shown. The memory block BLK1 and the memory block BLK2 may share the bit lines BL1 to BLm and the common source line CSL.

Referring to FIG. 3, the memory block BLK1 and the memory block BLK2 may be coupled to the plurality of bit lines BL1 to BLm.

The memory block BLK1 may include a plurality of strings ST1 to STm. Each of the strings ST1 to STm may be coupled between the bit lines BL1 to BLm and the common source line CSL. Each of the cell strings ST1 to STm may include a source selection transistor SST, memory cells C0 to Cn, and a drain selection transistor DST. Each of the cell strings ST1 to STm may include a first dummy cell DC0 coupled between the source selection transistor SST and the memory cell C0 and a second dummy cell DC1 coupled between the drain selection transistor DST and the memory cell Cn.

According to an embodiment of the invention, it is Illustrated and described that one first dummy cell and one second dummy cell are arranged in one memory string. However, one or more first dummy cells and one or more second dummy cells may also be arranged in a single memory string. The source selection transistor SST may be coupled to a source selection line SSL1. The memory cells C0 to Cn may be coupled to the word lines WLs. The drain selection transistor DST may be coupled to a drain selection line DSL1. The first dummy cells DC0 may be coupled to a source pass word line SPWL1. The second dummy cells DC1 may be coupled to a drain pass word line DPWL1. The common source line CSL may be coupled to a source side of the source selection transistor SST. Each of the bit lines BL1 to BLm may be coupled to a drain side of the corresponding drain selection transistor DST.

The memory block BLK2 may have a similar structure to the memory block BLK1. In other words, the memory block BLK2 may include the plurality of strings ST1 to STm, and each of the strings ST1 to STm may be coupled between each of the bit lines BL1 to BLm and the common source line CSL. Each of the cell strings ST1 to STm may include the source selection transistor SST, the plurality of memory cells C0 to Cn coupled in series, and the drain selection transistor DST. The source selection transistor SST may be coupled to the source selection line SSL2. Each of the memory cells C0 to Cn may be coupled to the word lines WLs. The drain selection transistor DST may be coupled to the drain selection line DSL2. In addition, each of the cell strings ST1 to STm may include the first dummy cell DC0 coupled between the source selection transistor SST and the memory cell C0 and the second dummy cell DC1 coupled between the drain selection transistor DST and the memory cell Cn. The common source line CSL may be coupled to a source side of the source selection transistor SST. Each of the bit lines BL1 to BLm may be coupled to a drain side of the drain selection transistor DST.

As described above, the memory block BLK1 and the memory block BLK2 may have similar structures, and the drain selection lines DSL1 and DSL2 and the source selection lines SSL1 and SSL2 respectively coupled thereto may be electrically separated from each other.

Figure 4:
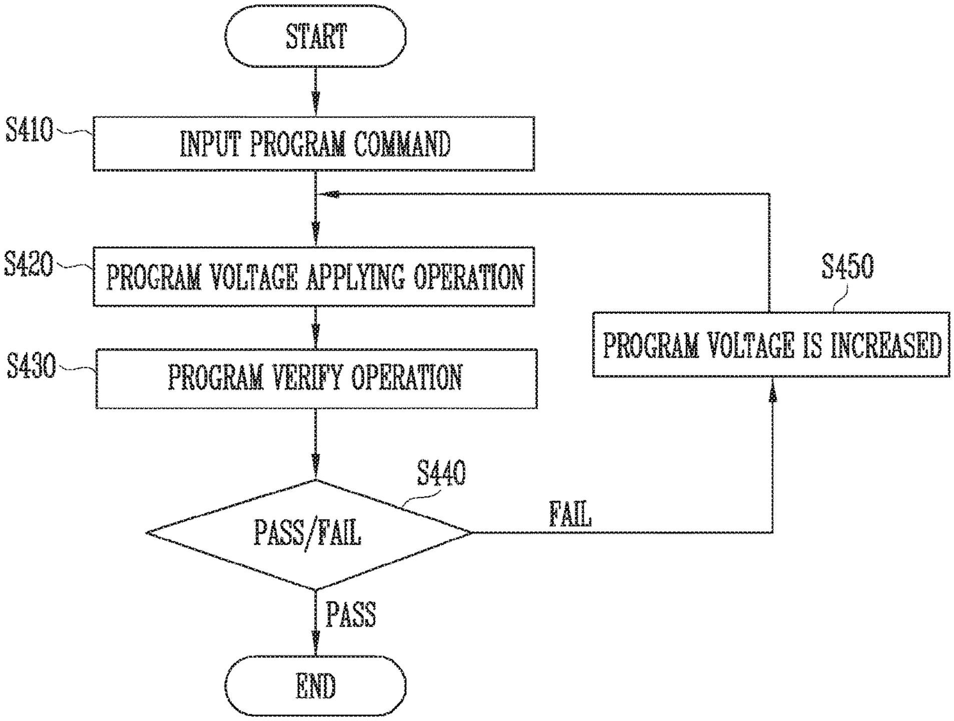
FIG. 4 is a flowchart illustrating a method of operating a semiconductor memory device, in accordance with an embodiment of the present invention.

FIG. 4 is a flowchart illustrating a method of operating a semiconductor memory device according to an embodiment.

Figure 5:
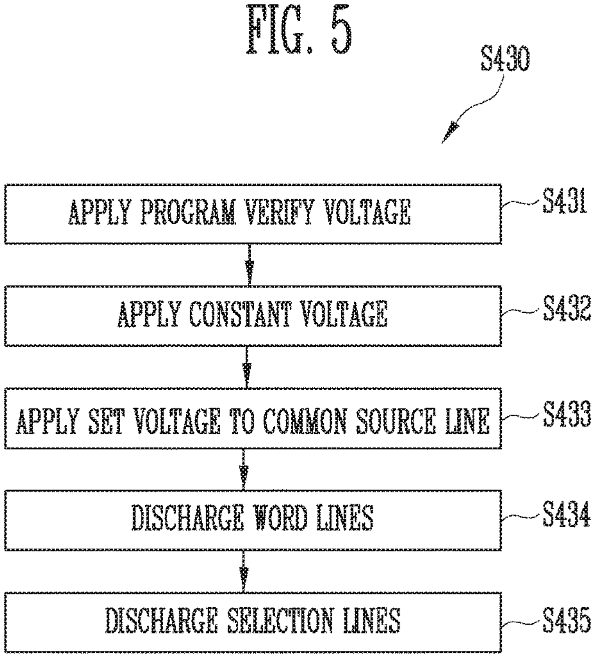
FIG. 5 is a flowchart illustrating a program verify operation, in accordance with an embodiment of the present invention.

FIG. 5 is a flowchart illustrating a program verify operation according to an embodiment of the invention, for example, the program verify operation S430 shown in FIG. 4.

Figure 6A:
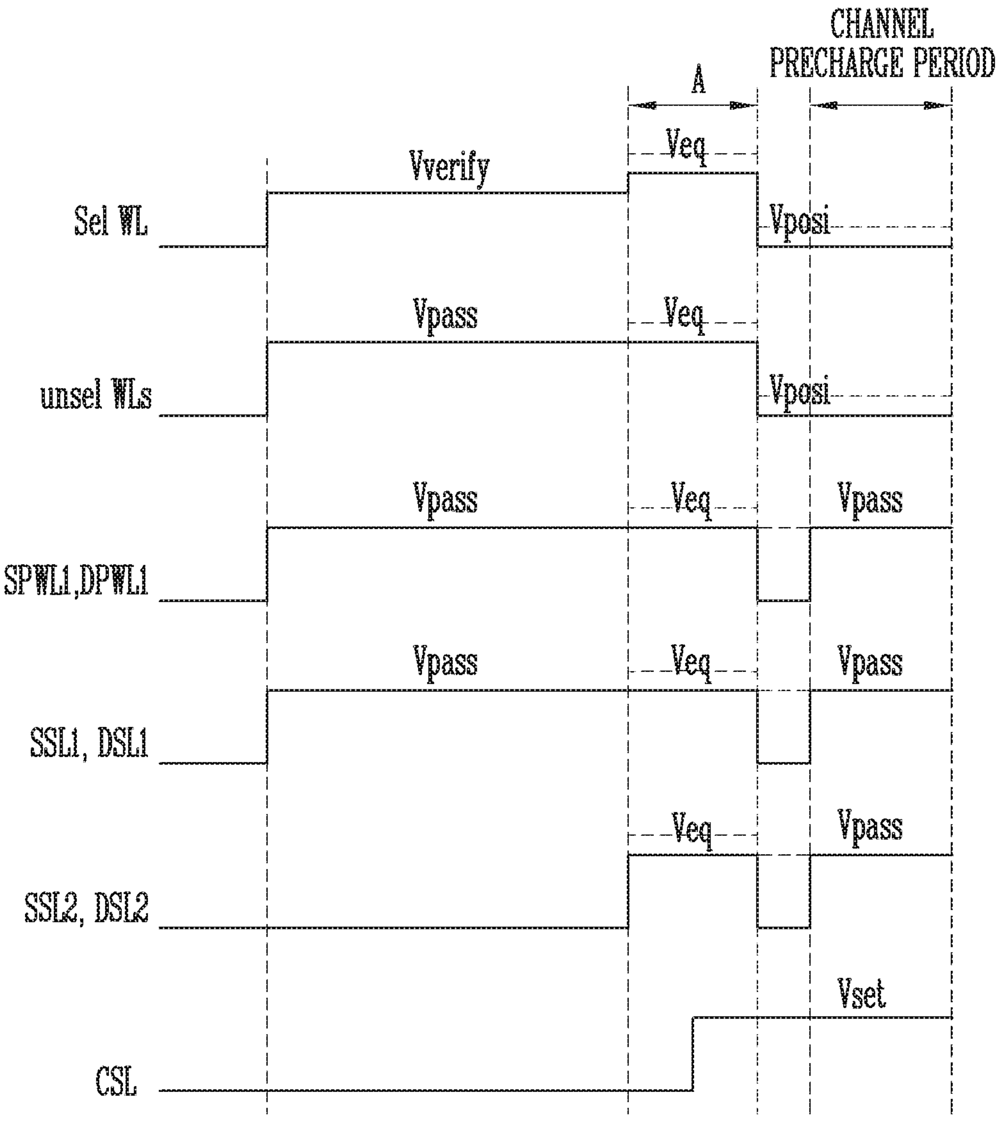
FIGS. 6A and 6B illustrates waveforms of operating voltages for a program verify operation in accordance with an embodiment of the present invention.

FIG. 6A illustrates a waveform of operating voltages for an example of a method of operating a program verify operation according to an embodiment.

Figure 6B:
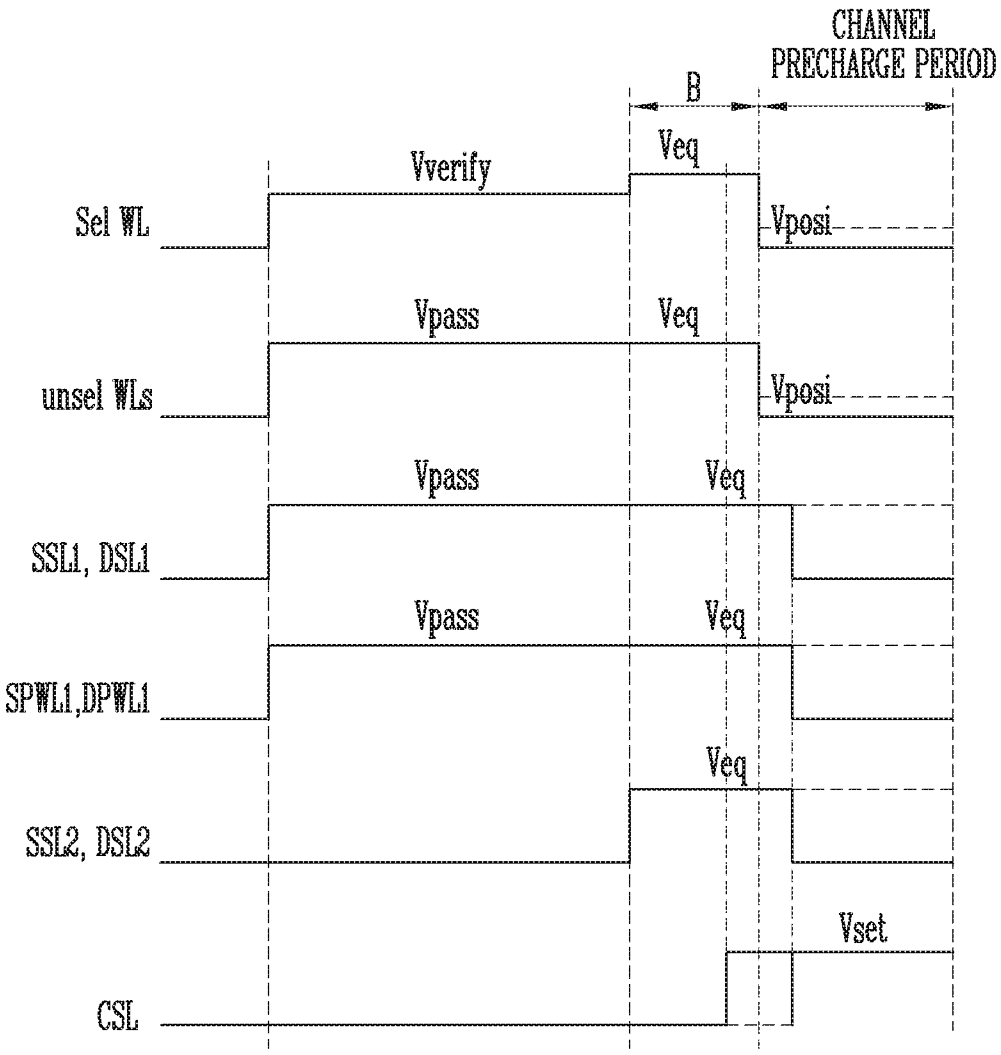

FIG. 6B illustrates a waveform of operating voltages for another example of a method of operating a program verify operation according to an embodiment.

A program operation of a semiconductor memory device is described below with reference to FIGS. 1 to 6B.

According to an embodiment, among the plurality of memory blocks, the memory block BLK1 may be defined as a selected memory block and the memory block BLK2 may be defined as an unselected memory block.

When the command CMD for a program command is externally input or received (S410), the read and write circuit 130 may temporarily store externally input data DATA in response to the control signals PB_signals output from the control logic 140 and control potentials of the corresponding bit lines BL1 to BLm in response to the temporarily stored data.

The voltage generator 150 may generate the program voltage Vpgm and the pass voltage Vpass in response to the control signals VG_signals received from the control logic 140.

The address decoder 120 may apply the program voltage Vpgm generated by the voltage generator 150 to a selected word line Sel WL, among the word lines WLs of the selected memory block BLK1, and the pass voltage Vpass to unselected word lines Unsel WLs in response to the control signals AD_signals received from the control logic 140, so that a program voltage applying operation may be performed (S420). Each of the drain selection line DSL1, the source selection line SSL1, the drain pass word line DPWL1, and the source pass word line SPWL1 of the selected memory block BLK1 may be turned on by the pass voltage Vpass applied thereto.

When the program voltage applying operation (S420) is completed, a program verify operation may be performed (S430).

A program verify operation according to an embodiment will be described below in more detail with reference to FIGS. 5 and 6A.

The voltage generator 150 may generate the verify voltage Vverify and the pass voltage Vpass in response to the control signals VG_signals received from the control logic 140. The address decoder 120 may apply the verify voltage Vverify to the selected word line Sel WL of the selected memory block BLK1 (S431) and the pass voltage Vpass to the unselected word lines Unsel WLs in response to the control signals AD_signals received from the control logic 140.

The drain selection line DSL1, the source selection line SSL1, the drain pass word line DPWL1, and the source pass word line SPWL1 of the selected memory block BLK1 may be turned on by the pass voltage Vpass applied thereto. The read and write circuit 130 may perform a sensing operation by sensing potential levels or the amounts of current in the bit lines BL1 to BLm to verify whether a plurality of memory cells coupled to the selected word line Sel WL are programmed to a threshold voltage level greater than a target threshold voltage level.

Subsequently, during a period A of FIG. 6A in which the memory cells C0 to Cn and the selection transistors SST and DST are turned on, the voltage generator 150 may generate and output the constant voltage Veq in response to the control signals VG_signals received from the control logic 140. Also, during the period A, the address decoder 120 may apply the constant voltage Veq to the selected word line Sel WL, the unselected word lines Unsel WLs, the drain selection line DSL1, the source selection line SSL1, the drain pass word line DPWL1, and the source pass word line SPWL1 of the selected memory block BLK1, and the drain selection line DSL2 and the source selection line SSL2 of the unselected memory block BLK2 in response to the control signals AD_signals received from the control logic 140 (S432). As a result, both the selected word line Sel WL and the unselected word lines Unsel WLs may be controlled to a level of the constant voltage Veq, and the memory cells C0 to Cn may be turned on. In addition, the drain selection transistor DST, the source selection transistor SST, and the first and second dummy cells DC0 and DC may be turned on by the constant voltage Veq applied to the drain selection line DSL1, the source selection line SSL1, the drain pass word line DPWL1, and the source pass word line SPWL1 of the selected memory block BLK1, and the drain selection line DSL2 and the source selection line SSL2 of the unselected memory block BLK2. In some embodiments, the constant voltage Veq may have the same potential level as the pass voltage Vpass or a potential level higher than the pass voltage Vpass.

During the period A, the drain selection transistor DST and the source selection transistor SST included in the unselected memory block BLK2 may be turned on by the constant voltage Veq, so that electrons generated or remaining in a channel of the unselected memory block BLK2 may be discharged to the common source line CSL and the bit lines BL1 to BLm, thereby improving electrical effects.

During the period A, the voltage generator 150 may generate the set voltage Vset having a positive potential level and output the set voltage Vset to the common source line CSL of the memory cell array 110 in response to the control signals VG_signals received from the control logic 140 (S433). As a result, a potential level of the common source line CSL may increase to the positive potential level.

When the period A ends, supply of the constant voltage Veq applied to the selected memory block BLK1 and the unselected memory block BLK2 may be blocked, and the potential levels of the word lines WLs of the selected memory block BLK1 may be discharged. The word lines WLs may be discharged to a ground voltage level or a positive potential level Vposi greater than the ground voltage level by a predetermined level (S434). The supply of the constant voltage Veq applied to the drain selection line DSL1, the source selection line SSL1, the drain pass word line DPWL1, and the source pass word line SPWL1 of the selected memory block BLK1 and the drain selection line DSL2 and the source selection line SSL2 of the unselected memory block BLK2 may be blocked, and the selection lines may be discharged to the ground voltage level (S435). During a channel precharge period, the pass voltage Vpass may be applied to the drain selection line DSL1, the source selection line SSL1, the drain pass word line DPWL1, and the source pass word line SPWL1 of the selected memory block BLK1 and the drain selection line DSL2 and the source selection line SSL2 of the unselected memory block BLK2, and a channel of the selected memory block BLK1 and the unselected memory block BLK2 may be precharged using the set voltage Vset applied to the common source line CSL.

The channel of the selected memory block BLK1 may be electrically isolated according to program states of the memory cells C0 to Cn. When the potential levels of the word lines WLs of the selected memory block BLK1 are discharged, since the potential level of the channel decreases to a negative level, a program disturb phenomenon may occur due to a low channel boosting level during the next program operation. According to an embodiment, the potential level of the channel may be increased by applying the set voltage Vset to the channel of the selected memory block BLK1 through the common source line CSL before the potential levels of the word lines WLs of the selected memory block BLK1 are discharged, so that the potential level of the channel may be prevented from dropping to a negative level during a discharge operation of the word lines WLs.

According to an embodiment, as illustrated in FIG. 6A, after the period A, the potential levels of the selection lines DSL1 and SSL1, the drain pass word line DPWL1 and the source pass word line SPWL1 of the selected memory block BLK1 and the selection lines DSL2 and SSL2 of the unselected memory block BLK2 may be maintained without being discharged. In other words, after the period A, a channel precharge operation may be directly performed after skipping the discharge operation of the selection lines DSL1, SSL1, DSL2, and SSL2, the drain pass word line DPWL1 and the source pass word line SPWL1, so that a program operation speed may be increased and current consumption may be reduced.

A program verify operation according to another embodiment will be described below in detail with reference to FIGS. 5 and 6B.

The voltage generator 150 may generate the verify voltage Vverify and the pass voltage Vpass in response to the control signals VG_signals received from the control logic 140. The address decoder 120 may apply the verify voltage Vverify to the selected word line Sel WL of the selected memory block BLK1 (S431) and the pass voltage Vpass to the unselected word lines Unsel WLs in response to the control signals AD_signals received from the control logic 140.

The drain selection line DSL1, the source selection line SSL1, the drain pass word line DPWL1, and the source pass word line SPWL1 of the selected memory block BLK1 may be turned on by the pass voltage Vpass applied thereto. The read and write circuit 130 may perform a sensing operation by sensing potential levels or the amounts of current in the bit lines BL1 to BLm to verify whether a plurality of memory cells coupled to the selected word line Sel WL are programmed to a threshold voltage level greater than a target threshold voltage level.

Subsequently, during a period B of FIG. 6B in which the memory cells C0 to Cn and the selection transistors SST and DST are turned on, the voltage generator 150 may generate and output the constant voltage Veq in response to the control signals VG_signals received from the control logic 140. Also, during the period B, the address decoder 120 may apply the constant voltage Veq to the selected word line Sel WL, the unselected word lines Unsel WLs, the drain selection line DSL1, the source selection line SSL1, the drain pass word line DPWL1, and the source pass word line SPWL1 of the selected memory block BLK1, and the drain selection line DSL2 and the source selection line SSL2 of the unselected memory block BLK2 in response to the control signals AD_signals received from the control logic 140 (S432). As a result, both the selected word line Sel WL and the unselected word lines Unsel WLs may be controlled to a level of the constant voltage Veq. In some embodiments, the constant voltage Veq may have the same potential level as the pass voltage Vpass or a potential level lower or higher than the pass voltage Vpass.

During the period B, the drain selection transistor DST and the source selection transistor SST included in the unselected memory block BLK2 may be turned on by the constant voltage Veq, so that electrons generated or remaining in a channel of the unselected memory block BLK2 may be discharged to the common source line CSL and the bit lines BL1 to BLm, thereby improving electrical effects.

During the period B, the voltage generator 150 may generate the set voltage Vset having a positive potential level and output the set voltage Vset to the common source line CSL of the memory cell array 110 in response to the control signals VG_signals received from the control logic 140 (S433). As a result, the potential level of the common source line CSL may increase to the positive potential level. According to an embodiment, it is illustrated and described that the set voltage Vset may be applied through the common source line CSL. However, the set voltage Vset may be applied through the bit lines BL1 to BLm, or the set voltage Vset may be applied through the common source line CSL and the bit lines BL1 to BLm.

When the period B ends, supply of the constant voltage Veq applied to the selected memory block BLK1 and the unselected memory block BLK2 may be blocked, and the potential levels of the word lines WLs of the selected memory block BLK1 may be discharged. The potential levels of the word lines WLs may be discharged to a ground voltage level or a positive potential level Vposi higher than the ground voltage level by a predetermined level (S434). After a predetermined time elapses after the discharge operation of the word lines WLs is completed, the supply of the constant voltage Veq applied to the drain selection line DSL1, the source selection line SSL1, the drain pass word line DPWL1, and the source pass word line SPWL1 of the selected memory block BLK1 and the drain selection line DSL2 and the source selection line SSL2 of the unselected memory block BLK2 may be blocked, and the selection lines may be discharged to the ground voltage level (S435). In other words, during the discharge operation of the word lines WLs, the drain selection line DSL1, the source selection line SSL1, the drain pass word line DPWL1, and the source pass word line SPWL1 of the selected memory block BLK1 may keep turned on, so that the channel may be prevented from being in a floating state. As a result, the potential level of the channel may be prevented from dropping to the negative potential level by the discharge operation of the word lines WLs.

A discharge operation of the drain selection line DSL1, the source selection line SSL1, the drain pass word line DPWL1, and the source pass word line SPWL1 of the selected memory block BLK1 and the drain selection line DSL2 and the source selection line SSL2 of the unselected memory block BLK2 may be skipped. A channel precharge operation may be performed using the set voltage Vset applied to the common source line CSL while maintaining the potential levels of the drain selection line DSL1, the source selection line SSL1, the drain pass word line DPWL1, and the source pass word line SPWL1 of the selected memory block BLK1 and the drain selection line DSL2 and the source selection line SSL2 of the unselected memory block BLK2.

As described above, according to another embodiment, a channel potential level may be prevented from dropping to a negative potential level during the discharge operation of the word lines WLs by increasing the channel potential level through the common source line CSL or the bit lines BL1 to BLm before the discharge operation of the word lines WLs. In addition, the channel may be prevented from being in a floating state by performing the discharge operation of the word lines WLs while the constant voltage Veq is applied to the selection lines SSL1 and DSL1 and the source and drain pass word lines SPWL1 and DPWL1 of the selected memory block.

When it is determined that all memory cells coupled to the selected word line Sel WL are programmed to a threshold voltage level greater than the target threshold voltage level, i.e., when the above-described program verify operation (S430) is determined as a pass, the program verify operation may be terminated. On the other hand, when it is determined that at least one memory cell has a threshold voltage level lower than the target threshold voltage level, the program verify operation may be determined as a fail. As a result, the program voltage Vpgm may be increased by a step voltage (S450), and the process flow proceeds back to the program voltage applying operation (S420).

As described above, according the described embodiments, by applying a positive set voltage Vset to the common source line CSL or the bit lines BL1 to BLm during a period in which a constant voltage Veq is applied to turn on memory cells during a program verify operation, a channel potential of a memory block may be prevented from dropping to a negative level when potential levels of word lines are discharged, so that a program disturb phenomenon may be prevented.

Figure 7:
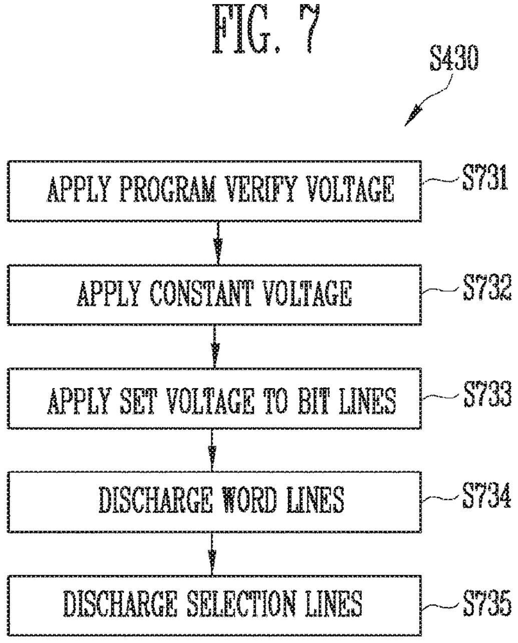
FIG. 7 is a flowchart illustrating a program verify operation in accordance with an embodiment of the present invention.

FIG. 7 is a flowchart illustrating a program verify operation according to another embodiment.

Figure 8:
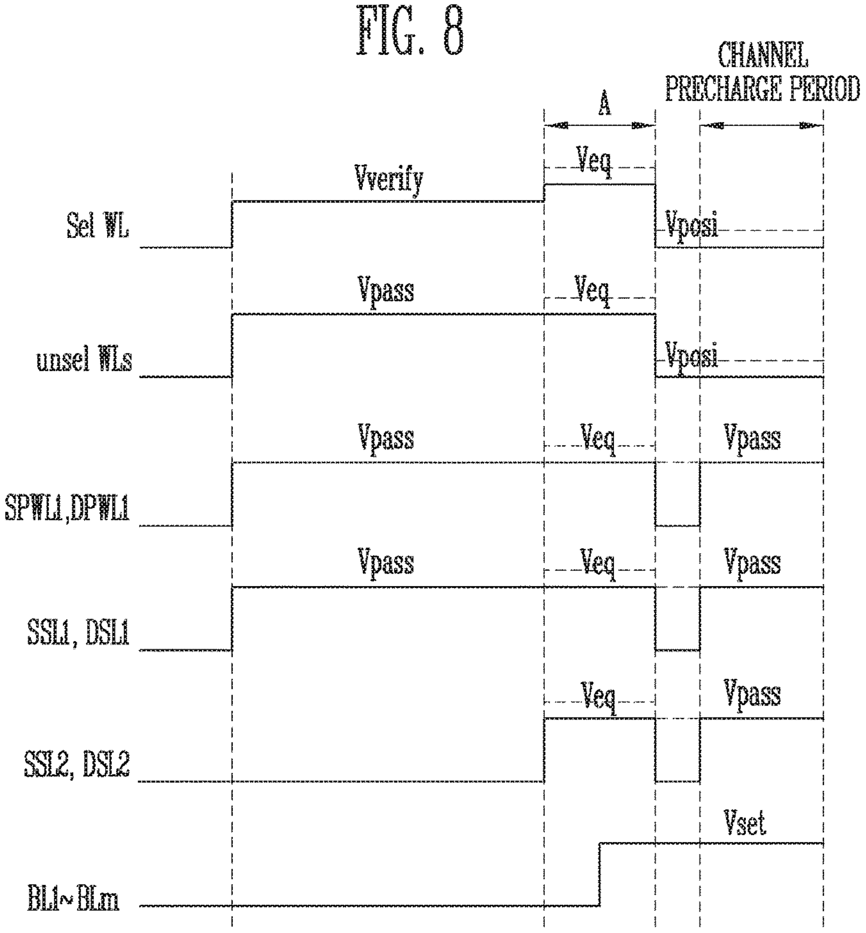
FIG. 8 illustrates a waveform of operating voltages for a program verify operation in accordance with an embodiment of the invention.

FIG. 8 illustrates a waveform of operating voltages for a program verify operation according to another embodiment, for example, a program verify operation S430 shown in FIG. 7.

A program verify operation according to another embodiment is described below with reference to FIGS. 7 and 8.

The voltage generator 150 may generate the verify voltage Vverify and the pass voltage Vpass in response to the control signals VG_signals received from the control logic 140. The address decoder 120 may apply the verify voltage Vverify to the selected word line Sel WL of the selected memory block BLK1 (S731) and the pass voltage Vpass to the unselected word lines Unsel WLs in response to the control signals AD_signals received from the control logic 140.

The drain selection line DSL1, the source selection line SSL1, the drain pass word line DPWL1, and the source pass word line SPWL1 of the selected memory block BLK1 may be turned on by the pass voltage Vpass applied thereto. The read and write circuit 130 may perform a sensing operation by sensing potential levels or the amounts of current in the bit lines BL1 to BLm to verify whether a plurality of memory cells coupled to the selected word line Sel WL have been programmed to a threshold voltage level greater than a target threshold voltage level.

Subsequently, during a period A of FIG. 8 in which the memory cells C0 to Cn are turned on, the voltage generator 150 may generate and output the constant voltage Veq in response to the control signals VG_signals received from the control logic 140. Also, during the period A, the address decoder 120 may apply the constant voltage Veq to the selected word line Sel WL, the unselected word lines Unsel WLs, the drain selection line DSL1, the source selection line SSL1, the drain pass word line DPWL1, and the source pass word line SPWL1 of the selected memory block BLK1, and the drain selection line DSL2 and the source selection line SSL2 of the unselected memory block BLK2 in response to the control signals AD_signals received from the control logic 140 (S732). As a result, both the selected word line Sel WL and the unselected word lines Unsel WLs may be controlled to a level of the constant voltage Veq, and the memory cells C0 to Cn may be turned on. In addition, the drain selection transistor DST, the source selection transistor SST, and the first and second dummy cells DC0 and DC may be turned on by the constant voltage Veq applied to the drain selection line DSL1, the source selection line SSL1, the drain pass word line DPWL1, and the source pass word line SPWL1 of the selected memory block BLK1, and the drain selection line DSL2 and the source selection line SSL2 of the unselected memory block BLK2. In some embodiments, the constant voltage Veq may have the same potential level as the pass voltage Vpass or a potential level lower or higher than the pass voltage Vpass.

During the period A, the drain selection transistor DST and the source selection transistor SST included in the unselected memory block BLK2 may be turned on by the constant voltage Veq, so that electrons generated or remaining in a channel of the unselected memory block BLK2 may be discharged to the common source line CSL and the bit lines BL1 to BLm, thereby improving electrical effects.

During the period A, the voltage generator 150 may generate the set voltage Vset having a positive potential level and output the set voltage Vset to the common source line CSL of the memory cell array 110 in response to the control signals VG_signals received from the control logic 140 (S733). As a result, the potential levels of the bit lines BL1 to BLm may Increase to the positive potential level, so that the channel potentials of the memory blocks BLK1 and BLK2 may be increased.

When the period A ends, supply of the constant voltage Veq applied to the selected memory block BLK1 and the unselected memory block BLK2 may be blocked, and the potential levels of the word lines WLs of the selected memory block BLK1 may be discharged. The word lines WLs may be discharged to a ground voltage level or the positive potential level Vposi higher than the ground voltage level by a predetermined level (S734). The supply of the constant voltage Veq applied to the drain selection line DSL1, the source selection line SSL1, the drain pass word line DPWL1, and the source pass word line SPWL1 of the selected memory block BLK1 and the drain selection line DSL2 and the source selection line SSL2 of the unselected memory block BLK2 may be blocked, and the selection lines may be discharged to the ground voltage level (S735). During a channel precharge period, the pass voltage Vpass may be applied to the drain selection line DSL1, the source selection line SSL1, the drain pass word line DPWL1, and the source pass word line SPWL1 of the selected memory block BLK1 and the drain selection line DSL2 and the source selection line SSL2 of the unselected memory block BLK2, and a channel of the selected memory block BLK1 and the unselected memory block BLK2 may be precharged using the set voltage Vset applied to the bit lines BL1 to BLm.

The channel of the selected memory block BLK1 may be electrically isolated according to program states of the memory cells C0 to Cn. When the potential levels of the word lines WLs of the selected memory block BLK1 are discharged, since the potential level of the channel decreases to a negative level, a program disturb phenomenon may occur due to a low channel boosting level during the next program operation. According to an embodiment, the potential level of the channel may be increased by applying the set voltage to the channel of the selected memory block BLK1 through the common source line CSL before the potential levels of the word lines WLs of the selected memory block BLK1 are discharged, so that the potential level of the channel may be prevented from dropping to a negative level during a discharge operation of the word lines WLs.

According to an embodiment and another embodiment of the invention, a program verify operation of a program operation of a semiconductor memory device is described as an example. However, the invention is not limited thereto. These embodiments may also be applicable to a read operation of the semiconductor memory device.

Figure 9:
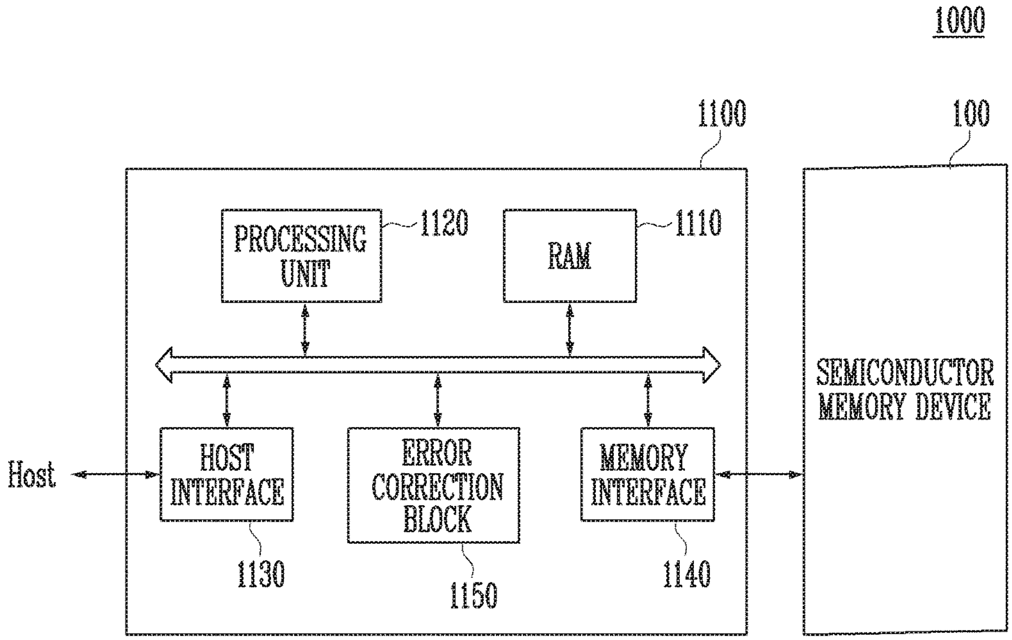
FIG. 9 is a block diagram illustrating a memory system including a semiconductor memory device shown in FIG. 1.

FIG. 9 is a block diagram illustrating a memory system 1000 including the semiconductor memory device 100 shown in FIG. 1.

Referring to FIG. 9, the memory system 1000 may include the semiconductor memory device 100 and a controller 1100.

The semiconductor memory device 100 may be configured and operated in substantially the same manner as described above with reference to FIG. 1. Thus, a detailed description thereof will be omitted.

The controller 1100 may be coupled between a host and the semiconductor memory device 100. The controller 1100 may access the semiconductor memory device 100 at the request of the host. For example, the controller 1100 may control a read operation, a program operation, an erase operation, and/or a background operation of the semiconductor memory device 100. The controller 1100 may provide an interface between the semiconductor memory device 100 and the host. The controller 1100 may drive firmware for controlling the semiconductor memory device 100.

The controller 1100 may include a random access memory (RAM) 1110, a processing unit 1120, a host interface 1130, a memory interface 1140 and an error correction block 1150. The RAM 1110 may be used as an operation memory of the processing unit 1120, a cache memory between the semiconductor memory device 100 and the host, and/or a buffer memory between the semiconductor memory device 100 and the host. The processing unit 1120 may control operations of the controller 1100. In addition, the controller 1100 may temporarily store program data provided from the host in the semiconductor memory device 100 during a write operation. According to an embodiment, information about program states/erase states of memory blocks stored in the control logic 140 as shown in FIG. 1 may be stored in the processing unit 1120 of the controller 1100.

The host interface 1130 may include a protocol for data exchange between the host and the controller 1100. According to an exemplary embodiment, the controller 1100 may communicate with the host using at least one of a variety of interface protocols, such as a universal serial bus (USB) protocol, a multimedia card (MMC) protocol, a peripheral component interconnection (PCI) protocol, a PCI-Express (PCIe) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, and a private protocol.

The memory interface 1140 may interface with the semiconductor memory device 100. For example, the memory interface may include a NAND interface or a NOR interface.

The error correction block 1150 may detect and correct errors in data received from the semiconductor memory device 100 by using an error correction code (ECC). The processing unit 1120 may control the semiconductor memory device 100 to control a read voltage according to an error detection result and perform a re-read. According to an embodiment, the error correction block 1150 may be provided as a component of the controller 1100.

The controller 1100 and the semiconductor memory device 100 may be integrated in one semiconductor device. According to an exemplary embodiment, the controller 1100 and the semiconductor memory device 100 may be integrated in a single semiconductor device to form a memory card such as a PC card (personal computer memory card international association (PCMCIA)), a compact flash card (CF), a smart media card (SMC), a memory stick, a multimedia card (e.g., MMC, RS-MMC or MMCmicro), an SD card (e.g., SD, miniSD, micro SD or SDHC), a universal flash storage device (UFS), etc.

The controller 1100 and the semiconductor memory device 100 may be integrated in a single semiconductor device to form a solid state drive (SSD). The SSD may include a storage device for storing data in a semiconductor memory device. When the memory system 1000 is used as an SSD, operational rates of the host coupled to the memory system 1000 may be significantly improved.

In another example, the memory system 1000 may be used as one of several elements in various electronic devices such as a computer, an ultra mobile PC (UMPC), a workstation, a net-book, a personal digital assistant (PDA), a portable computer, a web table, a wireless phone, a mobile phone, a smart phone, an e-book, a portable multimedia player (PMP), a portable game machine, a navigation device, a black box, a digital camera, a three-dimensional television, a digital audio recorder, a digital audio player, a digital picture recorder, a digital picture player, a digital video recorder, a digital video player, a device for transmitting/receiving information in wireless environments, devices for home networks, devices for computer networks, devices for telematics networks, a radio frequency identification (RFID) device, other devices for computing systems, etc.

According to an exemplary embodiment, the semiconductor memory device 100 or the memory system 1000 may be packaged in various forms. For example, the semiconductor memory device 100 or the memory system 1000 may be packaged by various methods such as a package on package (PoP), a ball grid array (BGA), a chip scale package (CSP), a plastic leaded chip carrier (PLCC), a plastic dual in line package (PDIP), a die in waffle pack, a die in wafer form, a chip on board (COB), a ceramic dual in line package (CERDIP), a plastic metric quad flat package (MQFP), a thin quad flat package (TQFP), a small outline integrated circuit (SOIC), a shrink small outline package (SSOP), a thin small outline package (TSOP), a system in package (SIP), a multi chip package (MCP), a wafer-level fabricated package (WFP), a wafer-level processed stack package (WSP), etc.

Figure 10:
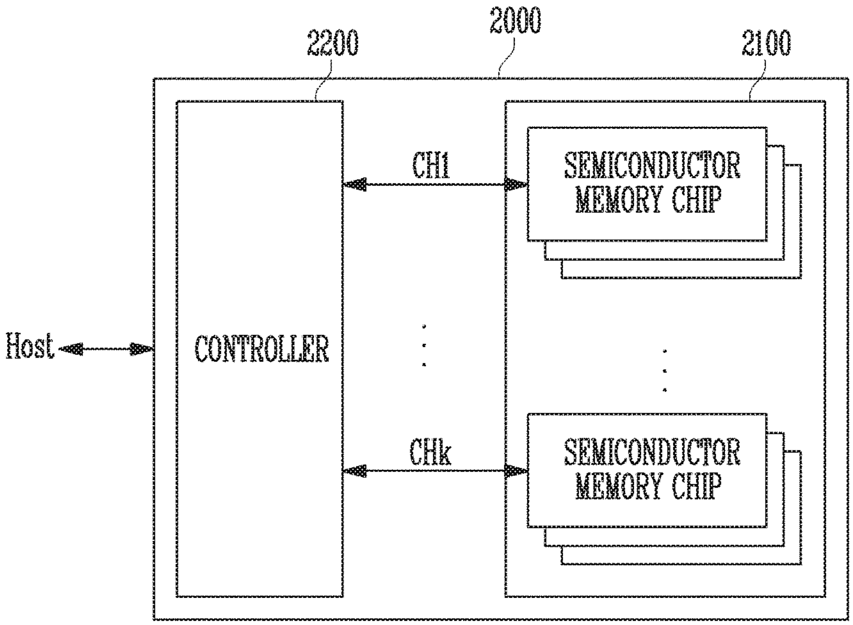
FIG. 10 is a block diagram illustrating an application example of a memory system shown in FIG. 9.

FIG. 10 is a block diagram illustrating an application example of the memory system 1000 shown in FIG. 9.

Referring to FIG. 10, a memory system 2000 may include a semiconductor memory device 2100 and a controller 2200. The semiconductor memory device 2100 may include semiconductor memory chips. The semiconductor memory chips may be divided into a plurality of groups.

FIG. 10 illustrates a plurality of semiconductor memory chip groups communicating with the controller 2200 through first to k-th channels CH1 to CHk. Each of the semiconductor memory chips may be configured and operated in substantially the same manner as the semiconductor memory device 100 described above with reference to FIG. 1.

Each semiconductor memory chip group may communicate with the controller 2200 through a single common channel. The controller 2200 may be configured in substantially the same manner as the controller 1100 described above with reference to FIG. 9, and configured to control the plurality of memory chips of the semiconductor memory device 2100 through the plurality of channels CH1 to CHk.

Figure 11:
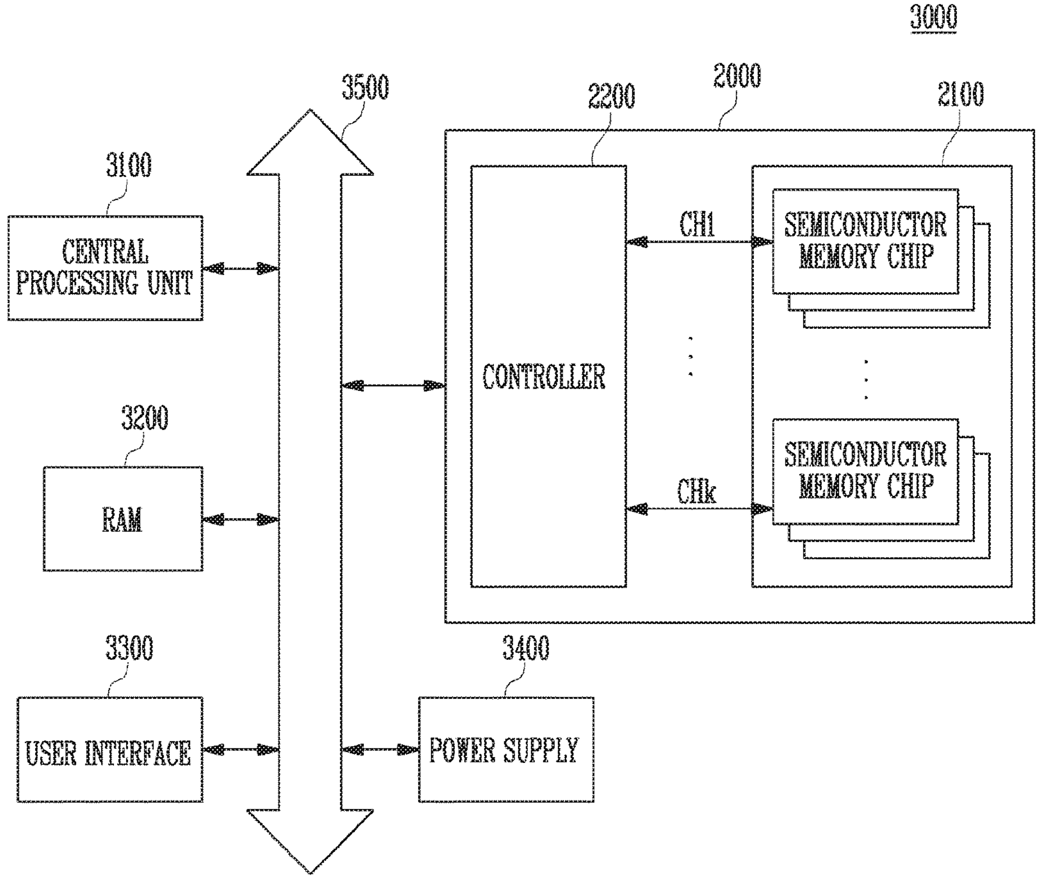
FIG. 11 is a block diagram illustrating a computing system including a memory system described with reference to FIG. 10.

FIG. 11 is a block diagram illustrating a computing system 3000 having the memory system 2000 described above with reference to FIG. 10.

Referring to FIG. 11, the computing system 3000 may include a central processing unit 3100, a random access memory (RAM) 3200, a user interface 3300, a power supply 3400, a system bus 3500, and the memory system 2000.

The memory system 2000 may be electrically connected to the central processing unit 3100, the RAM 3200, the user interface 3300 and the power supply 3400 through the system bus 3500. Data provided trough the user interface 3300 or processed by the central processing unit 3100 may be stored in the memory system 2000.

In FIG. 11, the semiconductor memory device 2100 may be coupled to the system bus 3500 through the controller 2200. However, the semiconductor memory device 2100 may be directly coupled to the system bus 3500, in which case, the central processing unit 3100 and the RAM 3200 may perform functions of the controller 2200.

As illustrated in FIG. 11, the memory system 2000 shown in FIG. 10 may be provided as the memory system 3000. However, the memory system 2000 may be replaced by the memory system 1000 shown in FIG. 9. According to an embodiment, the computing system 3000 may include both of the memory systems 1000 and 2000 described above with reference to FIGS. 9 and 10.

According to the present invention, by applying a positive voltage to a source line during a period in which memory cells and selection transistors are turned on during a program verify operation of a semiconductor memory device, a channel of a string may be prevented from being boosted to a negative voltage level, so that a program disturb phenomenon may be avoided.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A semiconductor memory device, comprising:

a memory string including a source selection transistor, a plurality of memory cells, and a drain selection transistor coupled in series between a common source line and a bit line; and a voltage generator applying operating voltages to a source selection line coupled to the source selection transistor, a plurality of word lines coupled to the plurality of memory cells, and a drain selection line coupled to the drain selection transistor during a verify operation, wherein the voltage generator increases a channel potential level of the memory string by applying a set voltage to the common source line or the bit line when applying a constant voltage to the source selection line, the plurality of word lines, and the drain selection line to turn on the source selection transistor, the plurality of memory cells, and the drain selection transistor.

2. The semiconductor memory device of claim 1, wherein the operating voltages include a verify voltage, a pass voltage and the constant voltage, and wherein during the verify operation, the voltage generator applies the verify voltage and the pass voltage to a selected word line and unselected word lines of the plurality of word lines, and subsequently applies the constant voltage to the source selection line, the plurality of word lines, and the drain selection line.

3. The semiconductor memory device of claim 2, wherein the constant voltage has the same potential level as the pass voltage, or a potential level lower or higher than a potential level of the pass voltage.

4. The semiconductor memory device of claim 2, wherein the voltage generator discharges potential levels of the word lines to a ground voltage or a positive voltage level greater than the ground voltage after applying the constant voltage.

5. The semiconductor memory device of claim 4, wherein the voltage generator discharges the potential levels of the plurality of word lines while maintaining potential levels of the source selection line and the drain selection line at the constant voltage after the verify operation.

6. A method of operating a semiconductor memory device, the method comprising:

applying a verify voltage and a pass voltage to a plurality of word lines of a memory cell array during a verify operation;

applying a constant voltage to the plurality of word lines and selection lines;

applying a set voltage to a common source line of the memory cell array when the constant voltage is applied; and discharging potential levels of the word lines while potential levels of the selection lines are maintained at the constant voltage.

7. The method according to claim 6, wherein the constant voltage has the same potential level as the pass voltage, or a greater potential level than a ground voltage.

8. The method according to claim 6, wherein the discharging of the potential levels of the word lines comprises discharging the potential levels of the word lines to a ground voltage level or a positive voltage level higher than the ground voltage level.

9. The method according to claim 6, wherein the applying of the set voltage to the common source line comprises applying the set voltage to bit lines of the memory cell array.

10. The method according to claim 6, wherein the selection lines comprise:

a drain selection line coupled to a drain selection transistor coupled between memory cells and bit lines; and a source selection line coupled to a source selection transistor coupled between the common source line and the memory cells.

11. The method according to claim 10, wherein the selection lines further comprise a source pass word line coupled to a dummy cell coupled between the memory cells and the source select transistor.

* * * * *